United States Patent [19]
Gotou

[11] Patent Number: 5,095,351
[45] Date of Patent: Mar. 10, 1992

[54] SEMICONDUCTOR DEVICE HAVING BIPOLAR TRANSISTOR AND METHOD OF PRODUCING THE SAME

[76] Inventor: Hiroshi Gotou, 1-16-2-105, Nobidome, Niiza-shi, Saitama 352, Japan

[21] Appl. No.: 255,974

[22] Filed: Oct. 11, 1988

[30] Foreign Application Priority Data

Oct. 9, 1987 [JP] Japan .................. 62-255686

[51] Int. Cl.$^5$ ............................. H01L 29/72
[52] U.S. Cl. ............................ 357/34; 357/22
[58] Field of Search ........................ 357/34, 22

[56] References Cited

U.S. PATENT DOCUMENTS 4,885,623 12/1989 Holm-Kennedy et al. .......... 357/34
4,910,562 3/1990 Solomon ........................ 357/34

OTHER PUBLICATIONS

Strum et al.—Navy Tech Disc. Bul.—vol. XII, No. 2, Dec. 1986—pp. 47–49.
Reedy et al.—Navy Tech. Disc. Bul.—vol. 11, No. 2, Dec. 1985—pp. 23–27.
J. C. Sturm et al., "Vertical Bipolar Transistors in Laser-Recrystallized Polysilicon", *IEEE Electron Device Letters*, vol. EDL-6, No. 8, Aug. 1985, pp. 400–402.
D. R. Bradbury et al., "Device Isolation in Lateral CVD Epitaxial Silicon-on-Insulator", *US Electrochemical Society, Extended Abstracts*, vol. 84, No. 2, 1984, pp. 767–768.
B-Y. Tsaur et al., "Fully Isolated Lateral Bipolar-MOS Transistors Fabricated in Zone-Melting-Recrystallized S: Films on SiO2", *IEEE Electron Device Letters*, vol. EDL-4, No. 8, Aug. 1983.
James C. Sturm et al., "A Lateral Silicon-on-Insulator Bipolar Transistor with a Self-Aligned Base Contact", *IEEE Electron Device Letters*, vol. EDL-8, No. 3, Mar. 1987.

*Primary Examiner*—Edward J. Wojciechowicz

[57] ABSTRACT

A semiconductor device has a base substrate made of a conductor or a semiconductor, an insulator layer formed on the base substrate, an active layer made of a semiconductor and formed on the insulator layer, where the active layer at least has a bipolar transistor formed therein having a base region, an emitter region and a collector region in the active layer, and a voltage source for applying a potential difference across the base substrate and the active layer in such a direction that an electric-field-induced layer is formed in the active layer in a vicinity of an interface between the insulator layer and the active layer. The electric-field-induced layer is used as a portion of a collector electrode of the bipolar transistor.

10 Claims, 9 Drawing Sheets

SEMICONDUCTOR DEVICE HAVING BIPOLAR TRANSISTOR AND METHOD OF PRODUCING THE SAME

BACKGROUND OF THE INVENTION

The present invention generally relates to semiconductor devices and methods of producing the same, and more particularly to a semiconductor device having an active layer in which at least a bipolar transistor is formed and a method producing such a semiconductor device.

Figure 1:
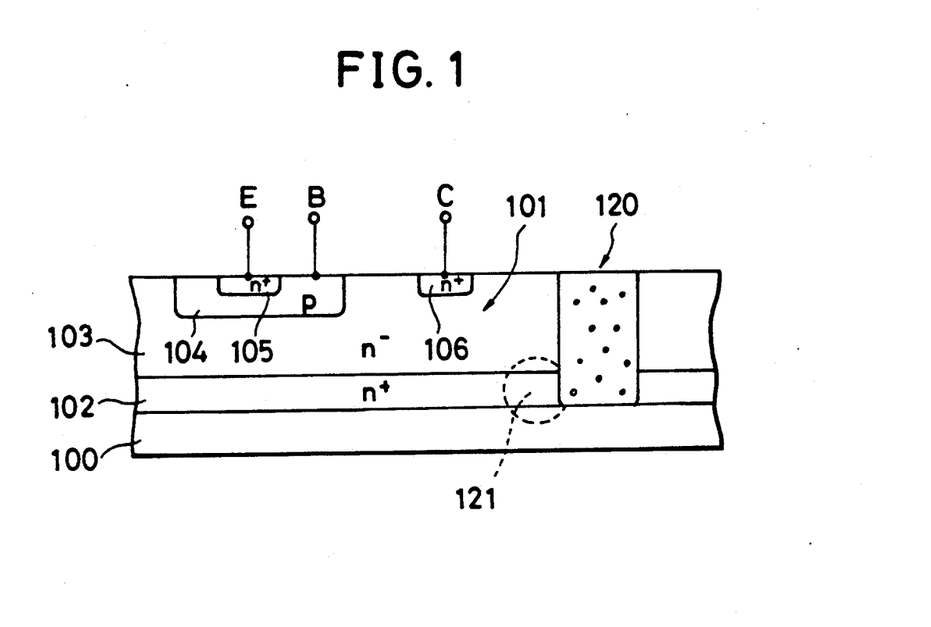
FIG. 1 is a cross sectional view showing an illustrative bipolar transistor formed on an insulator layer.

FIG. 1 shows an illustrative bipolar transistor formed on an insulator layer. In FIG. 1, the bipolar transistor has a silicon dioxide ($SiO_2$) layer 100, a silicon (Si) active layer 101, an $n^+$-type buried collector region 102, an $n^-$-type region 103, a p-type base region 104, an $n^+$-type emitter region 105, and an $n^+$-type collector wall region 106. In such an npn bipolar transistor, a portion of a collector electrode is made of the $n^+$-type buried collector region 102 having a high impurity density. For this reason, a surface area of the collector electrode is large and a stray capacitance of the collector has a value which cannot be neglected, thereby limiting the switching speed of an element. In addition, because the $n^-$-type region 103 is provided on the $n^+$-type buried collector region 102, in order to make a breakdown voltage between the base and the collector high it is essential that the production process includes an epitaxial growth process and this leads to a complex production process and a high production cost.

There are cases where a metal oxide semiconductor (MOS) element is formed in the same Si active layer 101 together with the bipolar transistor of the type described above. In such cases, the thickness of the Si active layer 101 should be set to a value in the range of 1 micron in order to realize a high-speed operation of the MOS element; however, the Si active layer 101 actually has a thickness in a range of 5 microns, for example, because of structural reasons of the bipolar transistor. In other words, if the Si active layer 101 is made extremely thin, it becomes impossible to form the bipolar transistor in the Si active layer 101.

Figure 2:
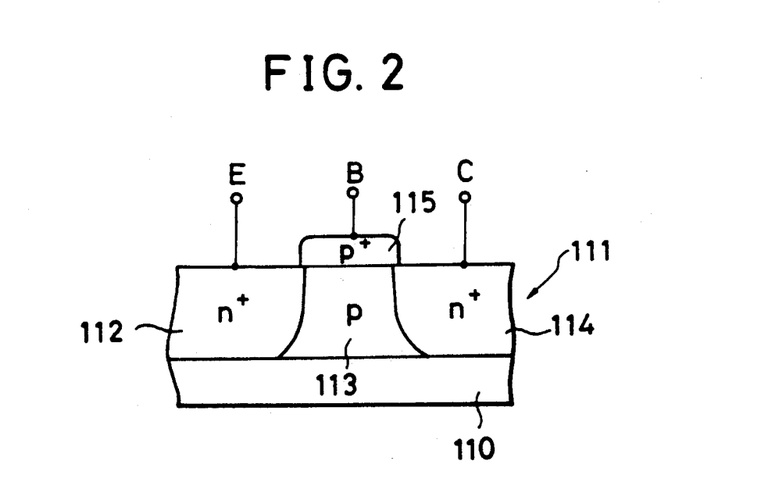
FIG. 2 is a cross sectional view showing an illustrative lateral bipolar transistor.

Accordingly, it is possible to consider forming a lateral bipolar transistor having a lateral structure in the thin active layer. FIG. 2 shows an illustrative lateral bipolar transistor having an $SiO_2$ layer 110, an Si active layer 111, an $n^+$-type emitter region 112, a p-type base region 113, an $n^+$-type collector region 114, and a $p^+$-type emitter electrode 115. Such a lateral npn bipolar transistor has an advantage in that the lateral npn bipolar transistor can be formed in an extremely thin Si active layer 111, but suffers disadvantages in that the amplification is small and the breakdown voltage between the base and the collector is low.

On the other hand, when a trench isolation 120 is formed, as shown in FIG. 1 for the purpose of isolating elements, it has been confirmed that a large amount of lattice defects in the region 121 is generated in a vicinity of the trench isolation 120 because of the high impurity density of the $n^+$-type buried collector region 102. It is desirable that such lattice defects 121 are prevented from the point of view of improving the reliability of the semiconductor device. In addition, it is necessary to separate the collector region 102 and the trench isolation 120 by a certain distance horizontally in FIG. 1 in order to avoid the undesirable effects of the lattice defects 121, and there is a limit to improving the integration density of the semiconductor device.

Therefore, in the above described illustrative semiconductor devices in which at least a bipolar transistor is formed in an active layer, there are problems in that the surface area of the collector electrode is large and the stray capacitance of the collector has a value which cannot be neglected, thereby limiting the switching speed of the element. In addition, because of the structure of the bipolar transistor, it is impossible to make the active layer extremely thin. Furthermore, there are also problems in that the production process must include the epitaxial growth process which makes the production process complex and the production cost high.

SUMMARY OF THE INVENTION

Accordingly, it is a general object of the present invention to provide a novel and useful semiconductor device and method of producing the same, wherein the problems described above are eliminated.

Another and more specific object of the present invention is to provide a semiconductor device having a base substrate made of a conductor or a semiconductor, an insulator layer formed on the base substrate, an active layer made of a semiconductor and formed on the insulator layer, where the active layer at least has a bipolar transistor formed therein having a base region, an emitter region and a collector region in the active layer, and a voltage source for applying a potential difference across the base substrate and the active layer in such a direction that an electric-field-induced layer is formed in the active layer in the vicinity of the interface between the insulator layer and the active layer. The electric-field-induced layer is used as a portion of a collector electrode of the bipolar transistor. Accordingly to the semiconductor device of the present invention, it is possible to reduce the surface area of the collector electrode and hence reduce the stray capacitance of the collector because the electric-field-induced layer is used as a portion of the collector electrode. Further, since the thickness of the active layer is substantially reduced by the formation of the electric-field-induced layer, it is possible to improve the switching speed of the element.

Still another object of the present invention is to provide a method of producing a semiconductor device comprising the steps of preparing a stacked structure comprising a base substrate of a conductor or a semiconductor material, a first insulator layer formed on the base substrate and an active layer made of a semiconductor material and formed on the first insulator layer, forming a U-shaped groove in the active layer and extended to the first insulator layer by an etching step, filling the U-shaped groove with an insulator material to form an insulator region, forming a diffusion region in the active layer adjacent to the U-shaped groove by an anisotropic etching step and a thermal diffusion step, forming a base region in the active layer by an ion implantation step and a thermal diffusion step, forming an emitter region in the base region by an ion implantation step and a thermal diffusion step, forming a second insulator layer on the active layer, forming three contact holes in the second insulator layer at positions respectively corresponding to the base region, the emitter region and the diffusion layer, and forming a base electrode, an emitter electrode and a collector electrode at the three contact holes. According to the method of the present invention, no epitaxial growth process is required to form the collector region, and the production process can be simplified thereby enabling a reduction in the production cost.

A further object of the present invention is to provide a method of producing a semiconductor device comprising the steps of preparing a stacked structure comprising a base substrate of a conductor or a semiconductor, a first insulator layer formed on the base substrate and an active layer of a semiconductor material and formed on the first insulator layer, forming a U-shaped groove in the active layer extended to the first insulator layer by an etching step, filling the U-shaped groove with an insulator material to form an insulator region, forming a diffusion region in the active layer adjacent to the U-shaped groove by an anisotropic etching step and a thermal diffusion step, forming an emitter region in the active layer by an ion implantation step and a thermal diffusion step at a position where the active layer constitutes a base region, forming a second insulator layer on the active layer, forming three contact holes in the second insulator layer at positions respectively corresponding to the base region, the emitter region and the diffusion layer, and forming a base electrode, an emitter electrode and a collector electrode at the three contact holes. According to the method of the present invention, no epitaxial growth process is required to form the collector region, and the production process can be simplified thereby enabling a reduction in the production cost.

Other objects and further features of the present invention will be apparent from the following detailed description when read in conjunction with the accompanying drawings.

DETAILED DESCRIPTION

Figure 3:
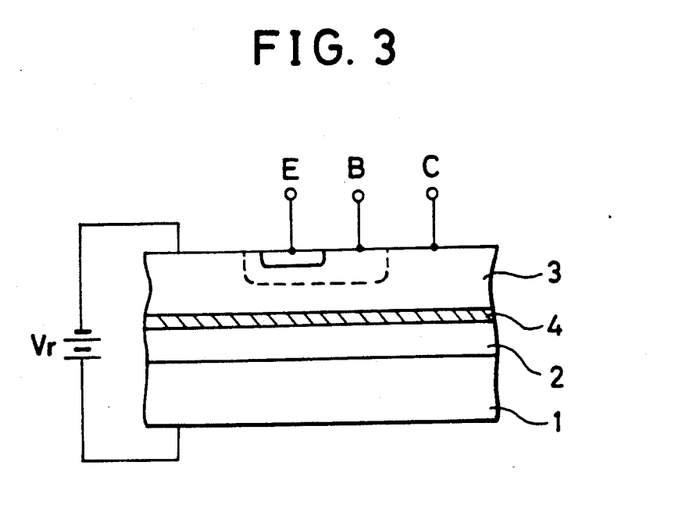
FIG. 3 is a cross sectional view of a semiconductor device according to the present invention for explaining the operating principle thereof.

FIG. 3 shows a semiconductor device according to the present invention for explaining an operating principle thereof. The semiconductor device has a base substrate 1 made of a conductor or a semiconductor material, an insulator layer 2 formed on the base substrate 1, and an active layer 3 made of a semiconductor material and formed on the insulator layer 2. At least a bipolar transistor is formed in the active layer 3. A potential difference Vr is applied across the base substrate 1 and the active layer 3 in such a direction that an electric-field-induced layer 4 is formed in the active layer 3 in a vicinity of an interface between the insulator layer 2 and the active layer 3. This electric-field-induced layer 4 is used as a portion of a collector electrode of a bipolar transistor.

Accordingly, the stray capacitance of the collector is reduced due to the reduced surface area of the collector electrode. Furthermore, it is possible to improve the switching speed of the element because it is possible to substantially reduce the thickness of the active layer 3.

Figure 4:
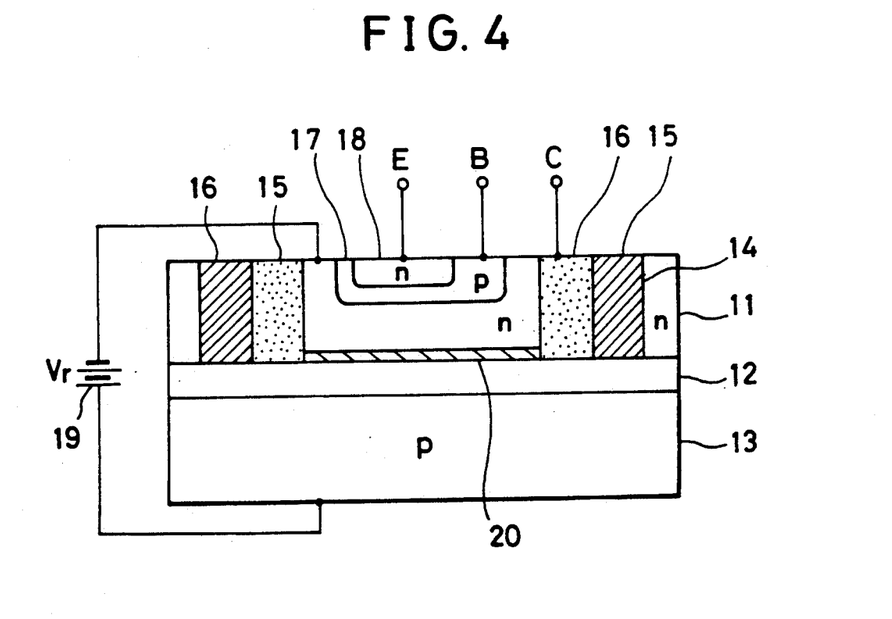
FIG. 4 is a cross sectional view showing a first embodiment of the semiconductor device according to the present invention.

FIG. 4 shows a first embodiment of the semiconductor device according to the present invention. The semiconductor device has an n-type Si active layer 11, an SiO$_2$ insulator layer 12, a p-type Si base substrate 13, a U-shaped groove 14, an SiO$_2$ insulator region 15 filling the U-shaped groove 14 for isolating elements, an n$^+$-type diffusion region 16 which reaches the SiO$_2$ insulator layer 12 for drawing out a collector electrode, a p-type base region 17, an n-type emitter region 18, a power source 19 for supplying a voltage Vr, and an electric-field-induced layer 20.

The power source 19 applied the potential difference Vr across the n-type Si active layer 11 and the p-type Si base substrate 13 in such a direction that the electric-field-induced layer 20 is formed in the n-type Si active layer 11 in a vicinity of the interface between the n-type Si active layer 11 and the SiO$_2$ insulator layer 12. The electric-field-induced layer 20 which is formed on the side of the n-type Si active layer 11 from the interface is continuous with the n$^+$-type diffusion region 16. Since the electric-field-induced layer 20 has a small resistance, the electric-field-induced layer 20 can be used as the collector electrode. In addition, because the thickness of the electric-field-induced layer 20 is 1000 Å or less, the electric-field-induced layer 20 is sufficiently thin compared to the diffusion layer of the conceivable illustrative semiconductor device described before. Accordingly, the surface area of the electric-field-induced layer 20 is small, and the stray capacitance of the collector electrode becomes small.

In this embodiment, the electric-field-induced layer 20 which becomes an accumulation layer is formed by applying the potential difference Vr across the n-type Si active layer 11 and the n-type Si base substrate 13, and this electric-field-induced layer 20 is used as a portion of the collector electrode of the npn bipolar transistor. As a result, the surface area of the collector electrode is reduced and the stray capacitance of the collector is also reduced. In addition, the switching speed of the element is improved because the thickness of the n-type Si active layer 11 is substantially reduced by the formation of the electric-field-induced layer 20. Furthermore, in addition to this improvement of the characteristic of the npn bipolar transistor, it is possible to simplify the production process of the semiconductor device because it is unnecessary to form an n+-type buried collector region by an epitaxial growth process as in the case of the conceivable illustrative semiconductor device described before.

Next, a description will be given of a method of producing the first embodiment of the semiconductor device according to the present invention as a first embodiment of a method of producing the semiconductor device according to the present invention, by referring to FIGS. 5A through 5D.

Figure 5A:
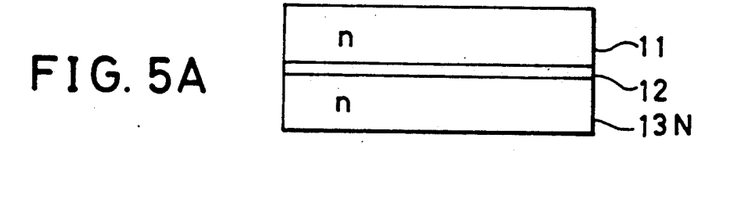
FIGS. 5A through 5D are cross sectional views for explaining a method of producing the first embodiment of the semiconductor device.

As shown in FIG. 5A, a stacked structure is prepared comprising the n-type Si active layer 11 having a resistivity of 2 Ωcm and a thickness of 1.5 microns, the SiO$_2$ insulator layer 12 having a thickness of 0.1 micron and an n-type Si base substrate 13N (used in place of the p-type Si base substrate 13 shown in FIG. 4) having a resistivity of 0.1 Ωcm and a thickness of 500 microns.

Figure 5B:
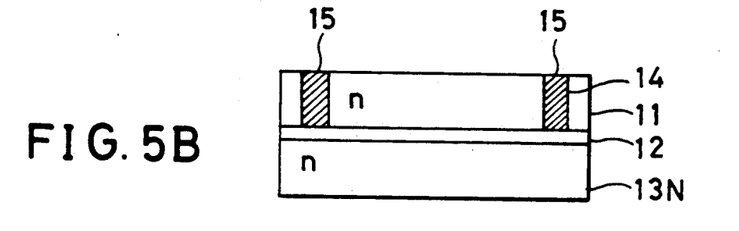

Then, as shown in FIG. 5B, the U-shaped groove 14 is formed by an anisotropic etching, and the U-shaped groove 14 is filled with an insulator which constitutes the SiO$_2$ insulator region 15.

Figure 5C:
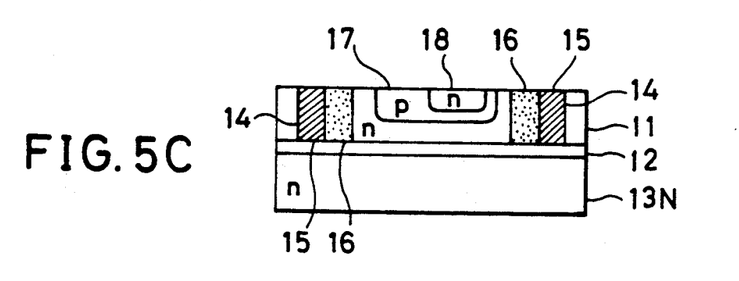

Next, as shown in FIG. 5C, the n+-type diffusion region 16 which makes contact with the collector electrode is formed b a phosphor ion implantation step and a thermal diffusion step. The p-type base region 17 is formed by a boron ion implantation step and a thermal diffusion step. In addition, the n-type emitter region 18 is formed by a phosphor ion implantation step and a thermal diffusion step.

Figure 5D:
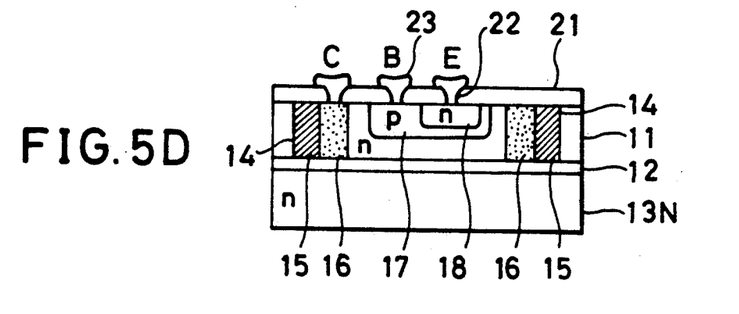

Finally, as shown in FIG. 5D, an insulator layer 21 is formed on the n-type Si active layer 11 and contact holes 22 are formed in the insulator layer 21 at position respectively corresponding to the p-type base region 17, the n-type emitter region 18 and the diffusion region 16 (collector region). Aluminum interconnections 23 are formed at the contact holes 22 so as to form a base electrode B, an emitter electrode E and a collector electrode C, thereby completing the semiconductor device.

When operating the npn bipolar transistor produced by the processes described in conjunction with FIGS. 5A through 5D, a positive voltage is applied to the n-type Si base substrate 13N and the electric-field-induced layer 20 is formed in the n-type Si active layer 11 as an accumulation layer and is used as a portion of the collector electrode. Hence, it is possible to obtain a collector electrode having a small stray capacitance. In addition, no epitaxial growth process is required in FIGS. 5A through 5D, thereby simplifying the production process of the semiconductor device.

Figure 6:
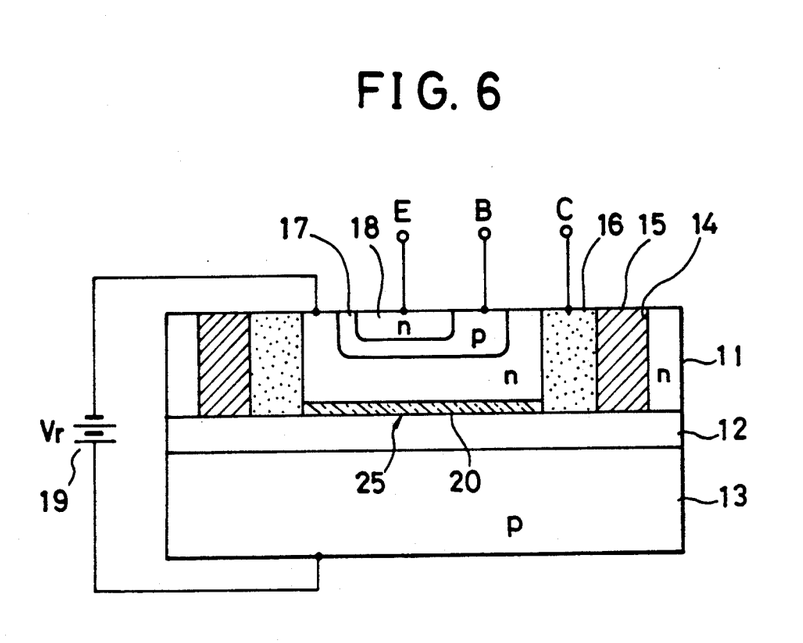
FIG. 6 is a cross sectional view showing a modification of the first embodiment of the semiconductor device.

FIG. 6 shows a modification of the first embodiment of the semiconductor device according to the present invention. In FIG. 6, those parts which are essentially the same as those corresponding parts in FIG. 4 are designated by the same reference numerals, and a description thereof will be omitted. In this modification, arsenide (As) is diffused the the n-type Si active layer 11 in the vicinity of the interface between the n-type Si active layer 11 and the SiO$_2$ insulator layer 12 so as to form a diffusion layer 25.

Next, a description will be given of a method of producing the modification of the first embodiment of the semiconductor device according to the present invention as a second embodiment of a method of producing the semiconductor device according to the present invention, by referring to FIGS. 7A through 7D.

Figure 7A:
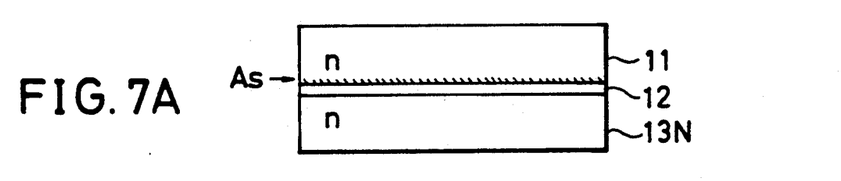
FIGS. 7A through 7D are cross sectional views for explaining a method of producing a modification of the first embodiment of the semiconductor device.

As shown in FIG. 7A, a stacked structure is prepared comprising the n-type Si active layer 11 having a resistivity of 2 Ωcm and a thickness of 1.5 microns, the SiO$_2$ insulator layer 12 having a thickness of 0.1 micron and the n-type Si base substrate 13N (used in place of the p-type Si base substrate 13 shown in FIG. 6) having a resistivity of 0.1 Ωcm and a thickness of 500 microns. Arsenide (As) is diffused in the n-type Si active layer 11 in the vicinity of the interface between the n-type Si active layer 11 and the SiO$_2$ insulator layer 12 to form the diffusion layer 25.

Figure 7B:
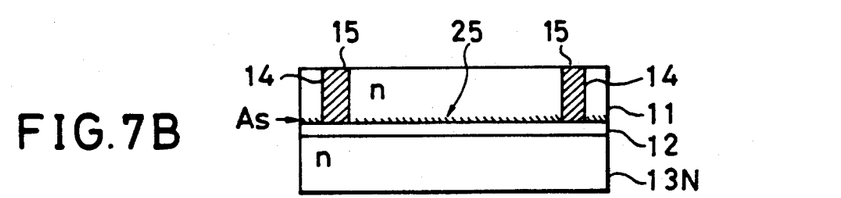
Figure 7C:
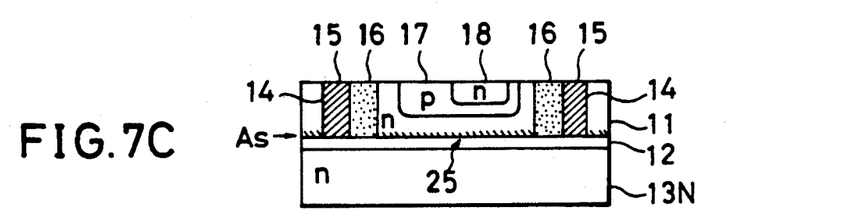
Figure 7D:
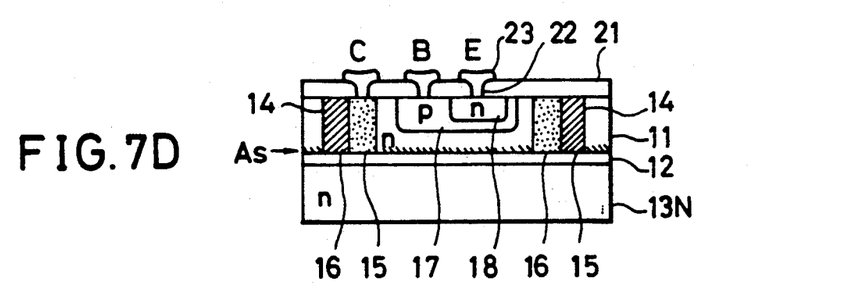

The processes shown in FIGS. 7B through 7D which are carried out thereafter respectively correspond to the processes shown in FIGS. 5B through 5D, and a description thereof will be omitted.

Figure 8:
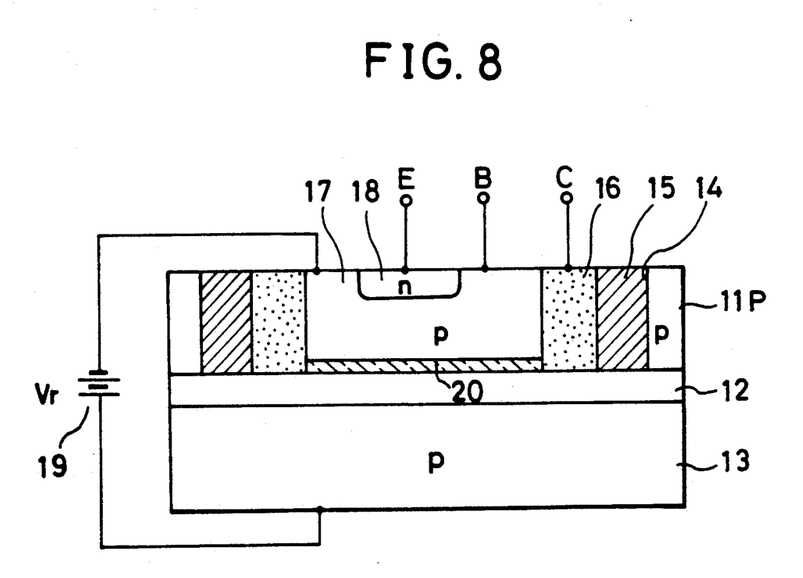
FIG. 8 is a cross sectional view showing a second embodiment of the semiconductor device according to the present invention.

FIG. 8 shows a second embodiment of the semiconductor device according to the present invention. In FIG. 8, those parts which are essentially the same as those corresponding parts in FIG. 4 are designated by the same reference numerals, and a description thereof will be omitted. In this embodiment, a p-type Si active layer 11P is used and the p-type base region 17 reaches the SiO$_2$ insulator layer 12. In addition, the potential difference Vr is applied across the p-type Si active layer 11P and the p-type Si base substrate 13 so as to form the electric-field-induced layer 20 which is used as an inversion layer. The electric-field-induced layer 20 is used as a portion of the collector electrode of the npn bipolar transistor. The effects obtainable in this embodiment are similar to those obtainable in the first embodiment of the semiconductor device described before.

Next, a description will be given of a method of producing the second embodiment of the semiconductor device according to the present invention as a third embodiment of a method of producing the semiconductor device according to the present invention, by referring to FIGS. 9A through 9D.

Figure 9A:
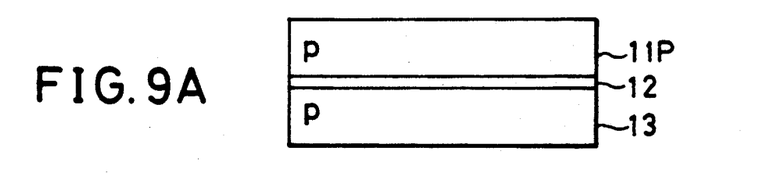
FIGS. 9A through 9D are cross sectional views for explaining a method of producing the second embodiment of the semiconductor device.

As shown in FIG. 9A, a stacked structure is prepared comprising the p-type Si active layer 11P having a resistivity of 2 Ωcm and a thickness of 1.5 microns, the SiO$_2$ insulator layer 12 having a thickness of 0.1 micron and the p-type Si base substrate 13 having a resistivity of 0.1 Ωcm and a thickness of 500 microns.

Figure 9B:
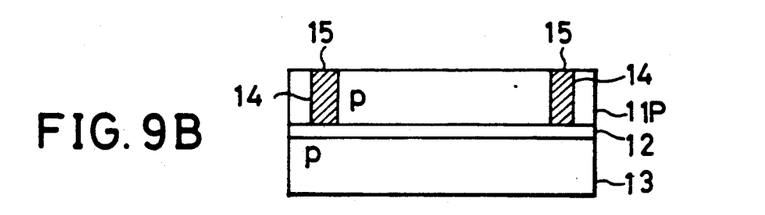

Then, as shown in FIG. 9B, the U-shaped groove 14 is formed by an anisotropic etching, and the U-shaped groove 14 is filled with an insulator which constitutes the SiO$_2$ insulator region 15.

Figure 9C:
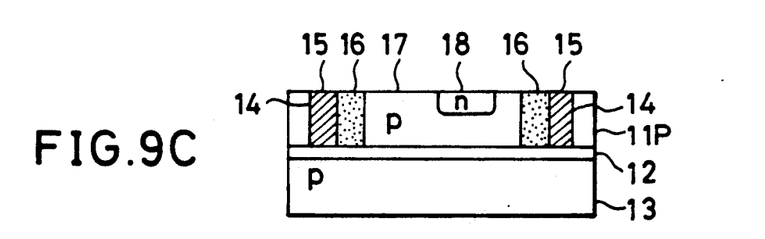

Next, as shown in FIG. 9C, the n+-type diffusion region 16 which makes contact with the collector electrode is formed by a phosphor ion implantation step and a thermal diffusion step. Thereafter, the n-type emitter region 18 is formed by a phosphor ion implantation and a thermal diffusion.

Figure 9D:
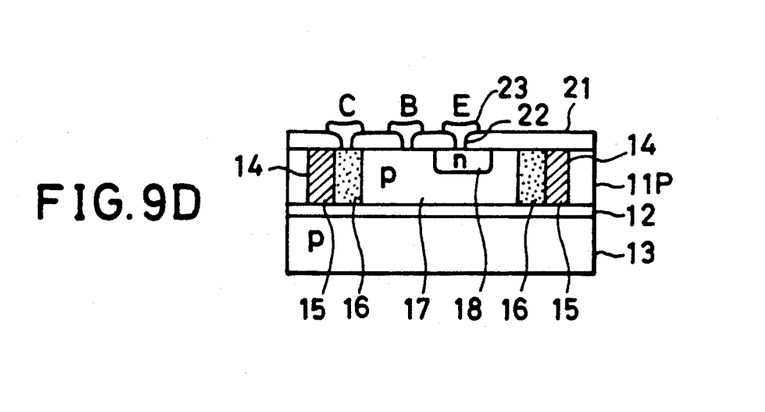

Finally, as shown in FIG. 9D, the insulator layer 21 is formed on the p-type Si active layer 11P and the contact hole 22 are formed in the insulator layer 21 at positions respectively corresponding to the base region, the n-type emitter region 18 and the diffusion region 16 (collector region). The aluminum interconnections 23 are formed at the contact holes 22 so as to form the base electrode B, the emitter electrode E and the collector electrode C, thereby completing the semiconductor device.

When operating the npn bipolar transistor produced by the processes described in conjunction with FIGS. 9A through 9D, a positive voltage is applied to the p-type Si base substrate 13 and the electric-field-induced layer 20 is formed in the p-type Si active layer 11P as an inversion layer and is used as a portion of the collector electrode. Hence, it is possible to obtain a collector electrode having a small stray capacitance. In addition, no epitaxial growth process is required in FIGS. 9A through 9D, thereby simplifying the production process of the semiconductor device.

According to the first and second embodiments described heretofore, it is possible to substantially reduce the thickness of the active layer by forming the electric-field-induced layer in the active layer in the vicinity of the interface between the active layer and the insulator layer. For this reason, when a MOS element is formed in the same active layer together with the bipolar transistor, it is possible to guarantee high-speed operation of the MOS element without sacrificing either the desired high application of the bipolar transistor or the breakdown voltage between the base and the collector.

Figure 10:
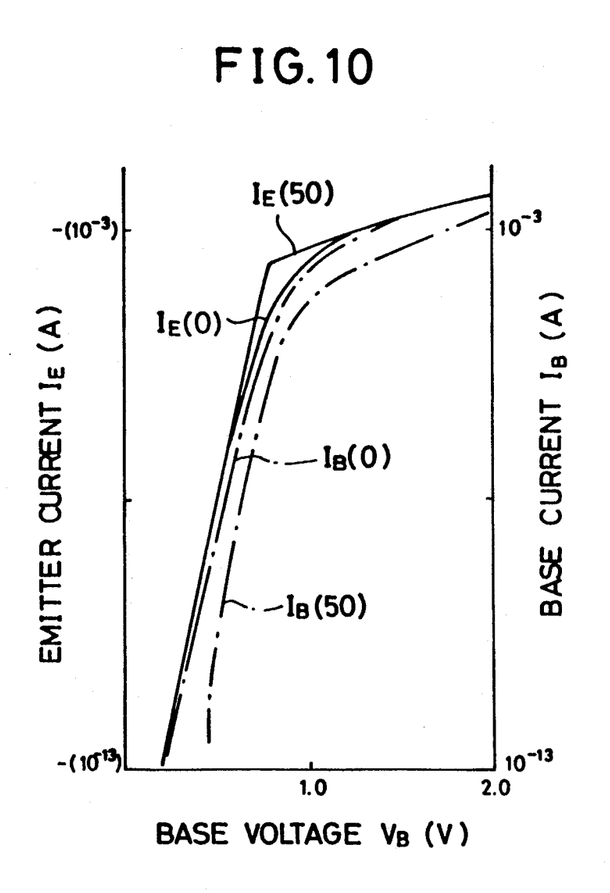
FIG. 10 shows an emitter current versus base voltage characteristic of a base current versus base voltage characteristic of the first embodiment of the semiconductor device.

FIG. 10 shows an emitter current $I_E$ versus base voltage $V_B$ characteristic and a base current $I_B$ versus base voltage $V_B$ characteristic of the first embodiment of the semiconductor device. The characteristics shown in FIG. 10 were measured for bias voltages Vr of 0 V and 50 V with an emitter size of 5 microns by 5 microns. $I_E(0)$ and $I_E(50)$ respectively denote the emitter currents $I_E$ for the bias voltages Vr of 0 V and 50 V, and $I_B(0)$ and $I_B(50)$ respectively denote the base currents $I_B$ for the bias voltages Vr of 0 V and 50 V.

Figure 11:
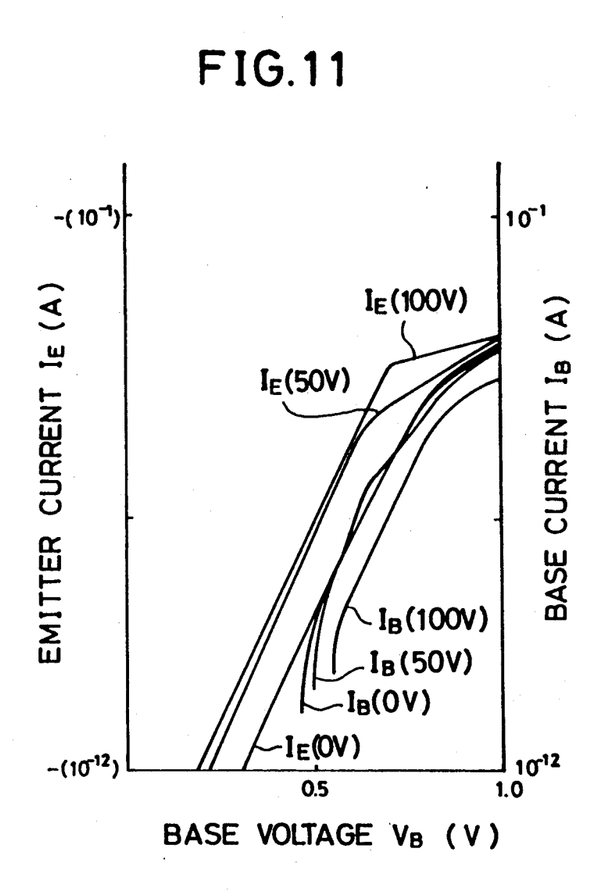
FIG. 11 shows an emitter current versus base voltage characteristic and a base current versus base voltage characteristic of the second embodiment of the semiconductor device.

FIG. 11 shows an emitter current $I_E$ versus base voltage $V_B$ characteristic and a base current $I_B$ versus base voltage $V_B$ characteristic of the second embodiment of the semiconductor device. The characteristics shown in FIG. 11 were measured for base substrate voltages of 0 V, 50 V and 100 V with an emitter size of 5 microns by 10 microns. $I_E(0\ V)$, $I_E(50\ V)$ and $I_E(100\ V)$ respectively denote the emitter currents $I_E$ for the base substrate voltages of 0 V, 50 V and 100 V, and $I_B(0\ V)$, $I_B(50\ V)$ and $I_B(100\ V)$ respectively denote the base currents $I_B$ for the base substrate voltages of 0 V, 50 V and 100 V.

Figure 12A:
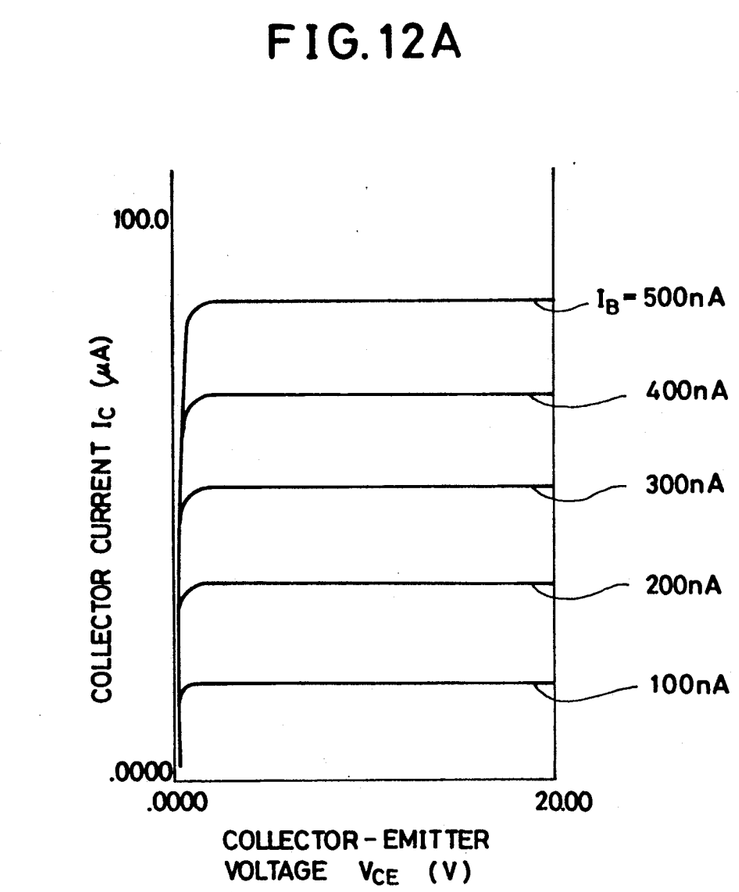
FIGS. 12A and 12B respectively show a collector current versus collector-emitter voltage characteristic of variations of the second embodiment of the semiconductor device of the invention.
Figure 12B:
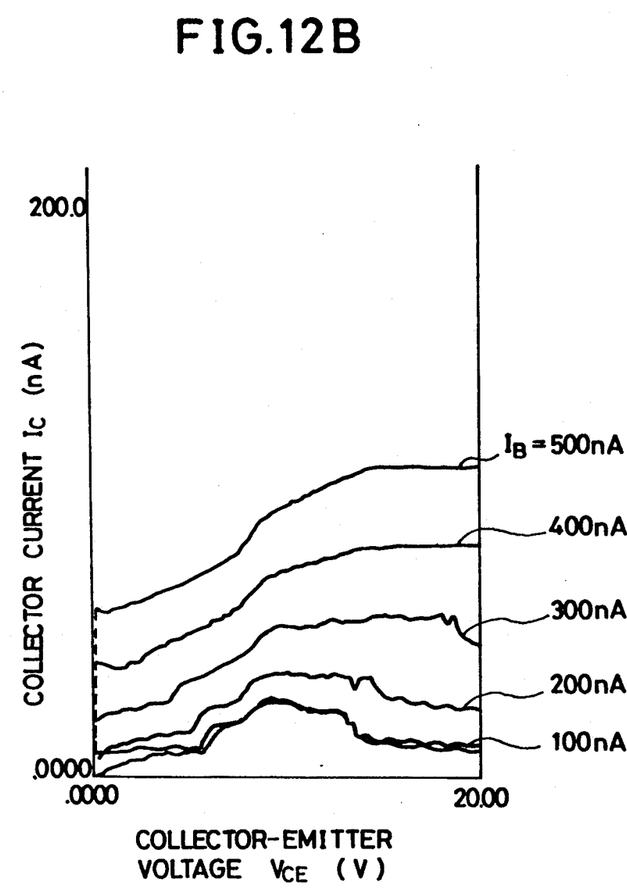

FIGS. 12A and 12B respectively show a collector current $I_C$ versus collector-emitter voltage $V_{CE}$ characteristic of the second embodiment of the semiconductor device. FIG. 12A shows the characteristic measured with the same emitter size used in measuring the characteristic shown in FIG. 11 for the bias voltage Vr of 50 V. On the other hand, FIG. 12B shows the characteristic measured with the same emitter size used in measuring the characteristic shown in FIG. 11 for the bias voltage Vr of 0 V.

As may be seen from FIGS. 10, 11, 12A and 12B, it was confirmed that the characteristic as a bipolar transistor is guaranteed even when the electric-field-induced layer which is formed by applying the potential difference Vr across the base substrate and the active layer is used as a portion of the collector electrode of the bipolar transistor.

Figure 13:
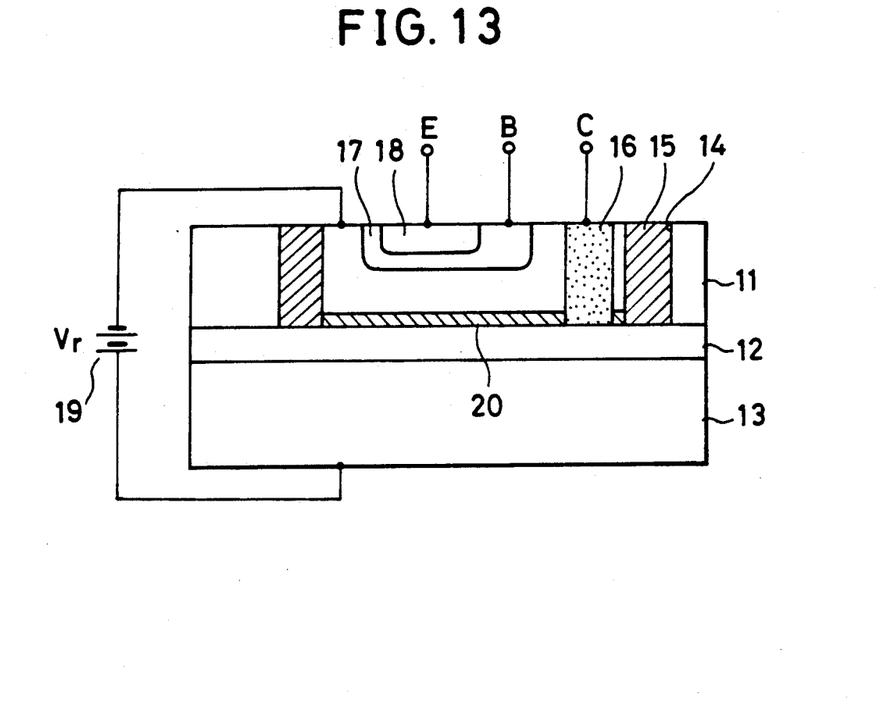
FIG. 13 is a cross sectional view showing a third embodiment of the semiconductor device according to the present invention.

FIG. 13 shows a third embodiment of the semiconductor device according to the present invention. In FIG. 13, those parts which are essentially the same as those corresponding parts in FIG. 4 are designated by the same reference numerals, and a description thereof will be omitted. In this embodiment, the n+-type diffusion region 16 does not make contact with the SiO₂ insulator region 15.

Figure 14:
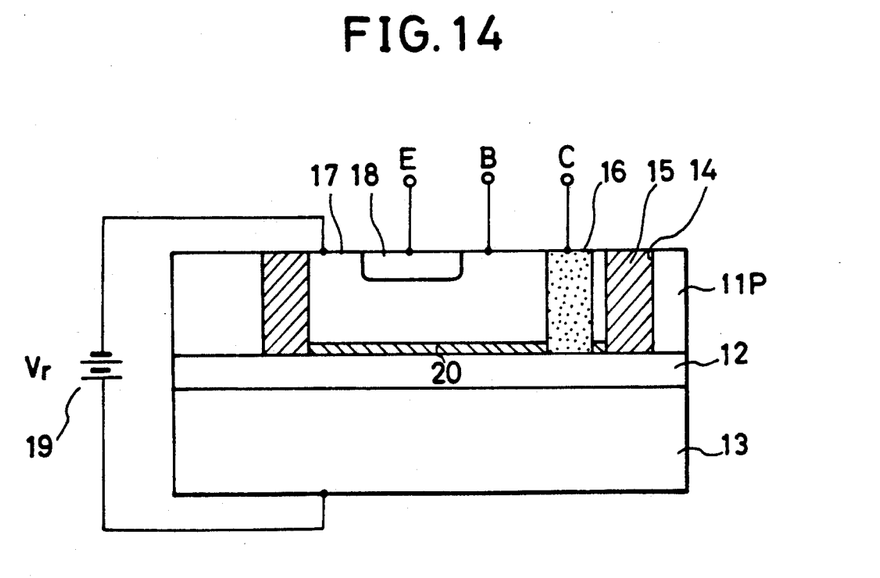
FIG. 14 is a cross sectional view showing a fourth embodiment of the semiconductor device according to the present invention.

FIG. 14 shows a fourth embodiment of the semiconductor device according to the present invention. In FIG. 14, those parts which are essentially the same as those corresponding parts in FIG. 8 are designated by the same reference numerals, and a description thereof will be omitted. In this embodiment, the n+-type diffusion region 16 also does not make contact with the SiO₂ insulator region 15.

In the third and fourth embodiments of the semiconductor device, no lattice defect is generated in a vicinity of the SiO₂ insulator region 15 because the n+-type diffusion region 16 having the high impurity density does not make contact with the SiO₂ insulator region 15. In addition, there are no undesirable effects on the integration density of the semiconductor device since no lattice defect is generated at a portion where the electric-field-induced layer 20 makes contact with the SiO₂ insulator region 15.

The embodiments described heretofore were described for the case where the bipolar transistor is an npn bipolar transistor. However, it is of course possible to similarly apply the present invention to a semiconductor device having a pnp bipolar transistor.

Further, the present invention is not limited to these embodiments, but various variations and modifications may be made without departing from the scope of the present invention.

What is claimed is:

1. A semiconductor substrate comprising:

a base substrate made of a conductor or a semiconductor material;

an insulator layer formed on said base substrate;

an active layer made of an n-type semiconductor material and formed on said insulator layer and defining an interface therebetween, said active layer having a bipolar transistor formed therein, said bipolar transistor having a base region, an emitter region and a collector region, each said region formed in said active layer; and means for applying a potential difference across said base substrate and said active layer in such a direction that an electric-field-induced accumulation layer is formed in said active layer in the vicinity of the interface between said insulator layer and said active layer, said electric-field-induced layer serving as a portion of a collector electrode of said bipolar transistor, said base region comprising a p-type region formed in said active layer, said emitter region comprising an n-type region formed in said p-type region, and said collector region comprising a diffusion region formed in said active layer and connected to said electric-field-induced layer.

2. A semiconductor device as claimed in claim 1 in which said base substrate is made of a p-type semiconductor.

3. A semiconductor device as claimed in claim 1 in which said base substrate is made of an n-type semiconductor.

4. A semiconductor device as claimed in claim 1 which further comprises an insulator region for isolating said bipolar transistor, said insulator region extending from a top of said active layer to said insulator layer.

5. A semiconductor device as claimed in claim 4 in which said insulator region makes direct contact with said active layer and said electric-field-induced layer.

6. A semiconductor device as claimed in claim 1 which further comprises a diffusion region formed in said active layer in a vicinity of the interface between said insulator layer and said active layer.

7. A semiconductor device as claimed in claim 4 wherein said insulator region is spaced apart from said diffusion region to prevent direct contact therewith.

8. A semiconductor device comprising:
a base substrate made of a conductor or a semiconductor material;
an insulator layer formed on said base substrate;
an active layer made of a p-type semiconductor material and formed on said insulator layer and defining an interface therebetween, said active layer having a bipolar transistor formed therein, said bipolar transistor having a base region, an emitter region and a collector region, each said region formed in said active layer;
means for applying a potential difference across said base substrate and said active layer in such a direction that an electric-field-induced inversion layer is formed in said active layer in the vicinity of the interface between said insulator layer and said active layer; and
an insulator region extending from the top of and through said active layer to said insulator layer for isolating said bipolar transistor,
said electric-field-induced inversion layer being used as a portion of a collector electrode of said bipolar transistor,
said base region comprising a p-type region formed in said active layer and extending to and reaching said insulator layer,
said emitter region comprising an n-type region formed in said p-type region,
said collector region comprising a diffusion region formed in said active layer and connected to said electric-field-induced layer, and
said insulator region being spaced apart from said diffusion region to prevent direct contact therewith.

9. A semiconductor device as claimed in claim 8 in which said base substrate is made of a p-type semiconductor material.

10. A semiconductor device as claimed in claim 8 in which said insulator region makes a direct contact with said active layer and said electric-field-induced layer.

* * * * *

UNITED STATES PATENT AND TRADEMARK OFFICE
CERTIFICATE OF CORRECTION

PATENT NO. : 5,095,351
DATED : March 10, 1992
INVENTOR(S) : Hiroshi GOTOU

It is certified that error appears in the above-identified patent and that said Letters Patent is hereby corrected as shown below:

* Col. 1,   line 11,   after "method" insert --for--.

Col. 3,   line 11,   change "extended" to --extending--;
            line 62,   change "of" to --and--.

Col. 4,   line 58,   delete "conceivable";
            line 66,   change "n-type" to --p-type--.

Col. 5,   line 12,   delete "conceivable";
            line 33,   change "b" to --by--.

Col. 6,   line 60,   after "implantation" insert --step--;
            line 61,   after "diffusion" insert --step--;
            line 64,   change "hole" to --holes--.

Signed and Sealed this

Nineteenth Day of October, 1993

Attest:

BRUCE LEHMAN

Attesting Officer   Commissioner of Patents and Trademarks

UNITED STATES PATENT AND TRADEMARK OFFICE
CERTIFICATE OF CORRECTION

PATENT NO. : 5,095,351
DATED : March 10, 1992
INVENTOR(S) : Hiroshi GOTOU

It is certified that error appears in the above-indentified patent and that said Letters Patent is hereby corrected as shown below:

On the title page, Item

--[73] Assignee: Fujitsu Limited, Kawasaki, Japan--.

Signed and Sealed this

First Day of March, 1994

Attest::

BRUCE LEHMAN

*Attesting Officer*  *Commissioner of Patents and Trademarks*